(12) United States Patent
Fuhrmann et al.

(10) Patent No.: US 10,680,523 B2
(45) Date of Patent: Jun. 9, 2020

(54) ELECTRONIC CIRCUIT WITH A HALF-BRIDGE CIRCUIT AND A VOLTAGE CLAMPING ELEMENT

(71) Applicant: Infineon Technologies Austria AG, Villach (AT)

(72) Inventors: Jan Fuhrmann, Rostock (DE); Thomas Basler, Ottenhofen (DE); Hans-Guenter Eckel, Rostock (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 16 days.

(21) Appl. No.: 16/055,757

(22) Filed: Aug. 6, 2018

(65) Prior Publication Data

US 2019/0044446 A1 Feb. 7, 2019

(30) Foreign Application Priority Data

Aug. 7, 2017 (DE) .................. 10 2017 117 888

(51) Int. Cl.
*H03K 17/56* (2006.01)
*H02M 3/158* (2006.01)
(Continued)

(52) U.S. Cl.
CPC ...... *H02M 3/1588* (2013.01); *H01L 29/0619* (2013.01); *H01L 29/0626* (2013.01);
(Continued)

(58) Field of Classification Search
CPC .... H02M 3/1588; H02M 1/088; H02M 7/538; H01L 29/1608; H01L 29/0619; H01L 29/0626; H01L 29/7393; H01L 29/872; H01L 29/16; H01L 29/868; H03K 2217/0072; H03K 2217/0063; H03K 17/168; H03K 17/163; H03K 17/162; H03K 17/08148; H03K 17/08142; H03K 17/6871; H03K 17/08122
(Continued)

(56) References Cited

U.S. PATENT DOCUMENTS 5,449,979 A * 9/1995 Ueoka ................ H05B 41/2855
315/209 R
5,892,717 A * 4/1999 Malarsie .................. H03K 5/08
365/175
(Continued)

FOREIGN PATENT DOCUMENTS

| DE | 10101852 A1 | 4/2002 |
| DE | 102005027442 A1 | 12/2006 |
| WO | 2006134009 A1 | 12/2016 |

*Primary Examiner* — Ryan Jager
(74) *Attorney, Agent, or Firm* — Slater Matsil, LLP

(57) ABSTRACT

In accordance with an embodiment, at least one switching circuit includes a voltage clamping element, and a half-bridge with a high-side switch and a low side-switch, wherein the high-side switch and the low-side switch each comprise a control node and a load path, and wherein the load paths of the high-side switch and the low side switch are connected in series. The voltage clamping element is connected in parallel with the half-bridge such that a first overall inductance of first conductors connecting the high-side switch and the low-side switch and connecting the voltage clamping element with the half-bridge is less than 20 nH.

20 Claims, 8 Drawing Sheets

(51) Int. Cl.

| | |
|---|---|
| *H03K 17/0814* | (2006.01) |
| *H03K 17/16* | (2006.01) |
| *H01L 29/06* | (2006.01) |
| *H01L 29/16* | (2006.01) |
| *H01L 29/739* | (2006.01) |
| *H01L 29/868* | (2006.01) |
| *H01L 29/872* | (2006.01) |
| *H02M 1/088* | (2006.01) |
| *H02M 7/538* | (2007.01) |
| *H03K 17/0812* | (2006.01) |
| *H03K 17/687* | (2006.01) |

(52) U.S. Cl.
CPC .......... *H01L 29/16* (2013.01); *H01L 29/7393* (2013.01); *H01L 29/868* (2013.01); *H01L 29/872* (2013.01); *H02M 1/088* (2013.01); *H02M 7/538* (2013.01); *H03K 17/08122* (2013.01); *H03K 17/08142* (2013.01); *H03K 17/08148* (2013.01); *H03K 17/162* (2013.01); *H03K 17/163* (2013.01); *H03K 17/168* (2013.01); *H03K 17/6871* (2013.01); *H01L 29/1608* (2013.01); *H03K 2217/0063* (2013.01); *H03K 2217/0072* (2013.01)

(58) Field of Classification Search
USPC .......................................................... 327/424
See application file for complete search history.

(56) References Cited

U.S. PATENT DOCUMENTS

| | | | |
|---|---|---|---|
| 8,482,945 B2* | 7/2013 | Kojima | B60L 53/52 |
| | | | 363/53 |
| 9,500,182 B2* | 11/2016 | Zagrodnik | H02M 7/003 |
| 2011/0038181 A1* | 2/2011 | Yan | H02M 1/32 |
| | | | 363/17 |
| 2011/0109239 A1* | 5/2011 | Kojima | H02M 5/08 |
| | | | 315/250 |
| 2011/0121774 A1* | 5/2011 | Shimada | H02M 1/4233 |
| | | | 318/729 |
| 2012/0268108 A1* | 10/2012 | Hozoi | G01R 15/202 |
| | | | 324/202 |
| 2016/0181948 A1 | 6/2016 | Eckel | |
| 2016/0278211 A1* | 9/2016 | Feng | H05K 1/144 |
| 2017/0025962 A1 | 1/2017 | Davidson | |
| 2017/0117798 A1 | 4/2017 | Basler et al. | |
| 2018/0183335 A1* | 6/2018 | Fan | H02M 3/155 |
| 2019/0067167 A1* | 2/2019 | Hong | H01L 25/16 |

* cited by examiner

ELECTRONIC CIRCUIT WITH A HALF-BRIDGE CIRCUIT AND A VOLTAGE CLAMPING ELEMENT

This application claims the benefit of German Application No. 102017117888.0, filed on Aug. 7, 2017, which application is hereby incorporated herein by reference in its entirety.

TECHNICAL FIELD

This disclosure in general relates to an electronic circuit, in particular an electronic circuit with a half-bridge circuit.

BACKGROUND

A half-bridge circuit includes a high-side switch and a low-side switch that each include a load path and a control node and that have their load paths connected in series. Usually, an output of the half-bridge is formed by a circuit node to which the load paths of both the high-side switch and the low-side are connected. Further, a series circuit with the high-side switch and the low-side switch may receive a supply voltage that is available between supply nodes.

A half-bridge circuit can be employed in a variety of different circuit applications such as voltage inverters, buck converters, or drive circuits for driving loads, to name only a few. Operation of a half-bridge circuit may include a switched-mode operation of the high-side switch and the low-side switch. Such switched-mode operation may result in abrupt changes of a current through one of the high-side switch or the low-side switch. In particular, such abrupt changes may occur if one of the high-side switch or the low-side changes from an on-state, in which it is conducting a current, to an off-state, in which it blocks. Abrupt changes of a current through one of the high-side switch or the low-side may induce voltage spikes with a voltage level much higher than the supply voltage in parasitic inductances of conductors that connect the high-side switch and the low-side of the half-bridge and that connect the half-bridge to the supply nodes.

At a given parasitic inductance, the more abrupt the current changes, the higher the voltage level of the voltage spike. In order to keep the voltage spikes below a certain voltage level, a switching speed of the high-side switch and the low-side switch may be reduced. This, however, increases switching losses. Another option would be to design the high-side switch and the low-side switch with a voltage blocking capability high enough to withstand the voltage spikes. Increasing the voltage blocking capability, however, may increase the on-resistance, which is the electrical resistance of the respective switch in the on-state, and, therefore, the conduction losses. Increasing the voltage blocking capability may also increase the switching losses, which are losses associated with switching on and switching off the transistor device.

SUMMARY

One example relates to an electronic circuit with at least one switching circuit. The least one switching circuit includes a voltage clamping element, and a half-bridge with a high-side switch and a low side-switch, wherein the high-side switch and the low-side switch each include a control node and a load path, and wherein the load paths of the high-side switch and the low side switch are connected in series. The voltage clamping element is connected in parallel with the half-bridge such that a first overall inductance of first conductors connecting the high-side switch and the low-side switch and connecting the voltage clamping element with the half-bridge is less than 20 nanohenries (nH).

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
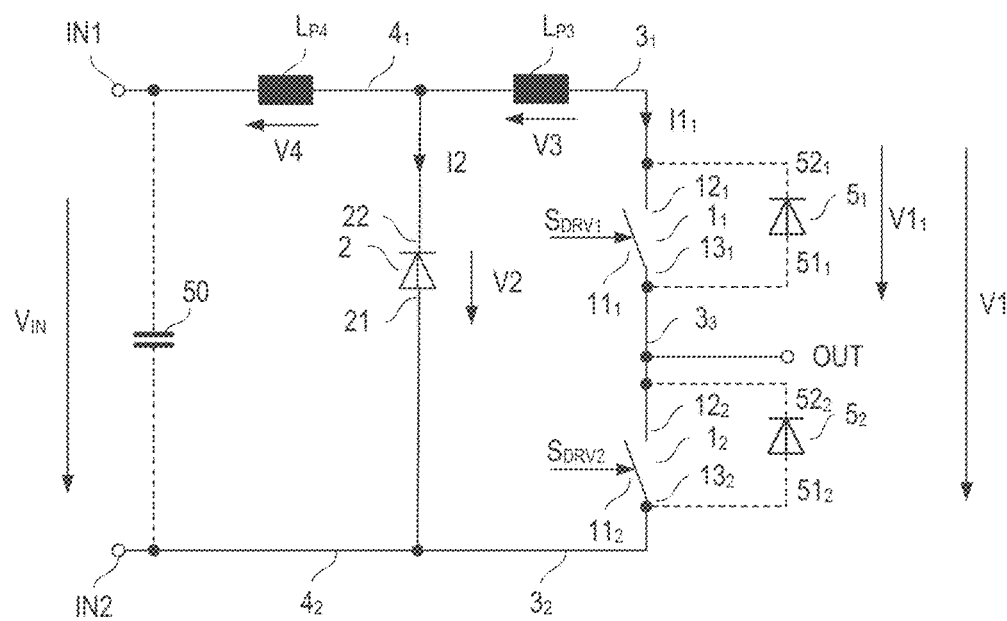
FIG. 1 shows an electronic circuit with a switching circuit according to one example.

FIG. 1 shows an electronic circuit with a switching circuit according to one example. The switching circuit includes a half-bridge and a clamping element 2. The half-bridge includes a first electronic switch $1_1$, which is referred to as high-side switch in the following, a second electronic switch $1_2$, which is referred to as low-side switch in the following, and a clamping element 2. Each of the high-side switch 11 and the low-side switch $1_2$ includes a control node $11_1$, $11_2$ and a load path between a first load node $12_1$, $12_2$ and a second load node 131, 132. The load paths of the high-side switch $1_1$ and the low-side switch $1_2$ are connected in series. A circuit node to which the load path $12_1$-$13_1$ of the high-side switch 11 and the load path $12_2$-$13_2$ of the low-side switch $1_2$ are connected thereto forms an output OUT of the half-bridge.

The high-side switch 11 is configured to receive a first drive signal $S_{DRV1}$ at the control node $11_1$, and its low-side switch 11 is configured to receive a second drive signal $S_{DRV2}$ at its control node $11_2$. Each of these first and second drive signals $S_{DRV1}$, $S_{DRV2}$ is configured to switch on or off the respective switch $1_1$, $1_2$. A drive circuit that generates these first and second drive signals $S_{DRV1}$, $S_{DRV2}$ is not shown in FIG. 1. One example of a drive circuit is explained with reference to FIG. 4 below.

The clamping element 2 is connected in parallel with the half-bridge. More specifically, the clamping element 2 is connected in parallel with a series circuit that includes the load path $12_1$-$13_1$ of high-side switch 11 and the load path $12_2$-$13_2$ of low-side switch $1_2$. Further, the half-bridge $1_1$, $1_2$ is coupled to an input of the electronic circuit. The input includes a first input node $IN_1$ and a second input node $IN_2$ and is configured to receive an input voltage VIN. Optionally, a capacitor 50 is connected between the first input node $IN_1$, and the second input node $IN_2$. This capacitor 50 is referred to as input capacitor in the following, but may also be referred to as DC link capacitor.

According to one example, the voltage clamping element 2 is connected in parallel with the half-bridge such that an overall parasitic inductance of conductors that connect the high-side switch $1_1$ and the low-side switch $1_2$ of the half-bridge and that connect the voltage clamping element 2 with the half-bridge is less than 20 nanohenries (nH), less than 10 nH, or even less than 5 nH. This overall parasitic inductance is referred to as first parasitic inductance in the following and is represented by inductance $L_{P3}$ in the circuit diagram shown in FIG. 1. Conductors that connect the high-side switch $1_1$ with the low-side switch $1_2$ and the voltage clamping element 2 with the half-bridge are schematically illustrated by connection lines in the circuit diagram shown in FIG. 1. According to one example, and as shown in FIG. 1, these conductors include a first conductor $3_1$, which connects the voltage clamping element 2 with the first load node $12_1$ of the first electronic switch $1_1$, a second conductor $3_2$, which connects the voltage clamping element 2 with the second load node $13_2$ of the low-side switch $1_2$, and a third conductor $3_3$, which connects the second load node $13_1$ of the high-side switch 11 and the first load node $12_2$ of the low-side switch $1_2$. This group of conductors $3_1$-$3_3$ is referred to as first group of conductors in the following.

In the circuit diagram shown in FIG. 1, the conductors $3_1$-$3_3$ of the first group are schematically illustrated by connection lines. In an implementation of the electronic circuit each of these conductors $3_1$-$3_3$ may include at least one of: a bond wire; a contact pad on a semiconductor chip; a trace on a printed circuit board; a flat conductor; or a metallization on an insulating substrate. Further, any type of electrically conducting material may be used to implement these conductors $3_1$-$3_3$. Examples of electrically conducting materials include, but are not restricted to, aluminum (Al), copper (Cu), gold (Au), silver (Ag), platinum (Pt), and any alloys formed from these elements. Examples of how these conductors $3_1$-$3_3$ may be implemented are explained herein further below.

A first parasitic inductance of less than 20 nH may be obtained, in an implementation of the electronic circuit, by physically arranging the clamping element 2 close to the half-bridge $1_1$, $1_2$ so as to have short conductors $3_1$-$3_3$ and, therefore, a low first parasitic inductance $L_{P3}$ of less than 20 nH.

In FIG. 1, $L_{P4}$ represents an overall parasitic inductance of a second group of conductors that connect the input $IN_1$, $IN_2$ or the input capacitor 50 with the switching circuit, in particular, with the voltage clamping element 2. This overall inductance is referred to as second parasitic inductance in the following. Referring to FIG. 1, the second group of conductors include a fourth conductor $4_1$ that connects the first input node IN1 with the voltage clamping element 2, and a fifth conductor $4_2$ that connects the second input node IN2 with the voltage clamping element 2. With regard to the implementation of these conductors $4_1$-$4_2$ of the second group everything set forth above with regard to the conductors $3_1$-$3_3$ of the first group applies equivalently.

According to one example, the switching circuit with the half-bridge $1_1$, $1_2$ and the clamping element 2 is connected to the input IN1, IN2 or the input capacitor 50 such that the second parasitic inductance $L_{P4}$ is greater than the first parasitic inductance $L_{P3}$. According to one example, a ratio $L_{P4}/L_{P3}$ between the second parasitic inductance $L_{P4}$ and the first parasitic inductance $L_{P1}$ is greater than 5, greater than 10, or greater than 20.

Figure 2:
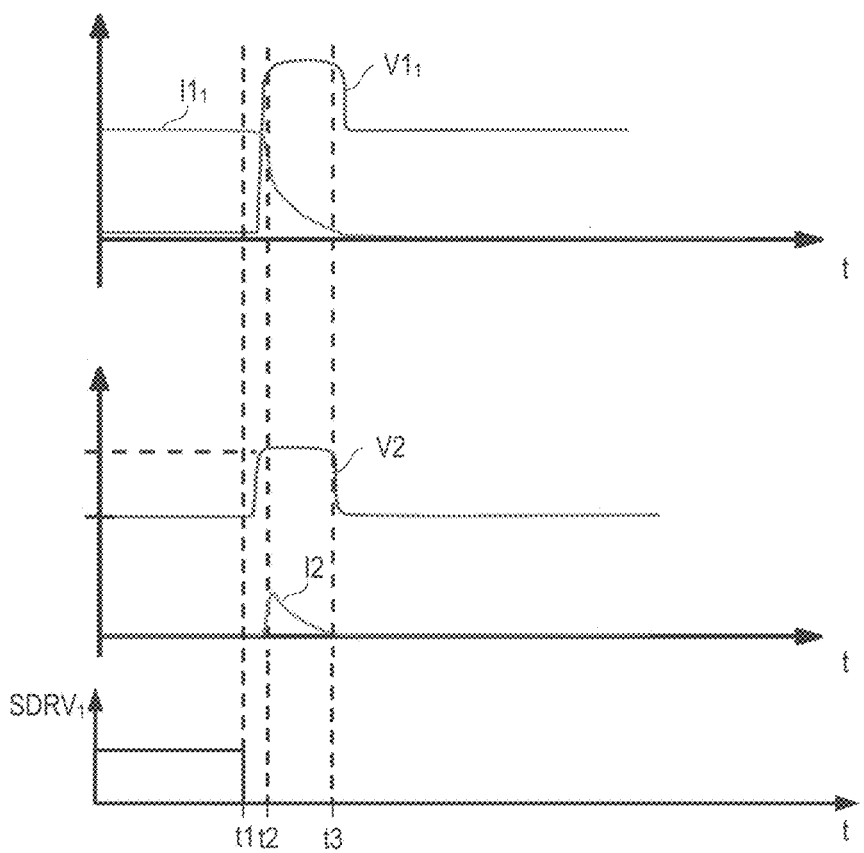
FIG. 2 shows timing diagrams that illustrate waveforms of signals occurring in the electronic circuit shown in FIG. 1 during operation.

FIG. 2 shows timing diagrams that illustrate the function of the voltage clamping element 2 in the switching circuit. In particular, FIG. 2 shows timing diagrams of the first drive signal $S_{DRV1}$ received by the control node $11_1$ of the high-side switch $1_1$, a voltage V2 across the voltage clamping element 2, a voltage V$1_1$ across the high-side switch $1_1$, a current I$1_1$ through the high-side switch $1_1$, and a current I2 through the voltage clamping element 2. The first drive signal $S_{DRV1}$ has one of an on-level, that switches on the high-side switch $1_1$, and an off-level, that switches off the high-side switch $1_1$. Just for the purpose of illustration, the on-level is drawn as a high signal level and the off-level is drawn as a low signal level in the example shown in FIG. 2. The low signal level may be zero or negative.

The timing diagrams shown in FIG. 2 begin at time when the high-side switch $1_1$ has been switched on so that a current I$1_1$ through the high-side switch $1_1$ is greater than zero, and the voltage V1 across the half-bridge essentially equals the input voltage $V_{IN}$. In FIG. 2, t1 denotes a time when a signal level of the first drive signal $S_{DRV1}$ changes from the on-level to the off-level in order to switch off the high-side switch $1_1$. Beginning at this first time t1, the current I$1_1$ through the high-side switch $1_1$, which is referred to as high-side current in the following, starts to decrease towards zero. This change of the high-side current I$1_1$ is associated with induced voltages V3 (see FIG. 1) in the first parasitic inductance $L_{P3}$ and V4 in the second parasitic inductance $L_{P4}$. The voltage V3 induced in the first parasitic inductance $L_{P3}$ is given by $$V3 = L_{P3} \cdot dI_1/dt \qquad (1),$$

where $L_{P3}$ denotes the first parasitic inductance and $dI_1/dt$ denotes a change of the high-side current I1 over time. As can be seen from equation 1, the voltage level of the induced voltage V3 is proportional to the first parasitic inductance $L_{P3}$ and proportional to the change $dI_1/dt$ of the high-side current I$1_1$. The change $dI_1/dt$ of the high-side current is dependent on a switching speed of the high-side switch $1_1$, that is, dependent on how fast the high-side switch $1_1$ switches from the on-state to the off-state. An example of how the switching speed of the high-side switch $1_1$ or the low-side switch $1_2$ can be adjusted is explained with reference to FIG. 4 herein further below.

When the high-side switch $1_1$ switches off, the voltage induced in the second parasitic inductance $L_{P4}$ causes the voltage V2 across the voltage clamping element 2 to increase to above the input voltage $V_{IN}$. When the voltage V2 across the clamping element 2 reaches a breakthrough voltage of the clamping element 2, the clamping element 2 starts to conduct a current and, therefore, clamps the voltage V2 to a voltage level that is essentially given by the breakthrough voltage of the clamping element 2. In FIG. 2, t2 denotes the time when the clamping element 2 starts to conduct, and t3 denotes the time when the voltage V1 across the half-bridge has decreased to below the breakthrough voltage of the clamping element 2 so that the current through the clamping element 2 turns zero.

FIG. 2 schematically illustrates the timing diagrams of the voltages V11, V2 and the currents $I1_1$, I2. Oscillations resulting from parasitic effects may superimpose these voltages and currents. Such oscillations, however, are not shown in FIG. 2.

Clamping the voltage V2 across the clamping element 2 has the effect that the voltage V1 across the half-bridge $1_1$, $1_2$ is clamped to a voltage level that is essentially given by the breakthrough voltage of the clamping element 2 plus the voltage V3 induced in the first parasitic inductance $L_{P3}$ by the change of the high-side current $I1_1$. As the clamping element 2 is arranged close to the half-bridge circuit with the high-side switch $1_1$ and the low-side switch $1_2$ such that the first parasitic inductance $L_{P3}$ is less than 20 nH, the voltage V1 across the half-bridge is only slightly greater than the clamping voltage even if the high-side switch $1_1$ switches off rapidly, which may result in abrupt changes of the high-side current $I1_1$. Thus, the clamping element 2 protects the half-bridge with the high-side switch $1_1$ and the low-side switch $1_2$ against overvoltage even at high switching speeds of the high-side switch $1_1$ and the low-side switch $1_2$. Thus, the switching speed of the high-side switch $1_1$ and the low-side switch $1_2$ can be adapted to the needs of the respective application and do not have to be adapted to keep voltages induced in parasitic inductances low in order to protect the half-bridge against overvoltage.

According to one example, the voltage clamping element 2 includes a diode with a voltage blocking capability greater than the input voltage $V_{IN}$ and being capable of being operated in an Avalanche mode repeatedly. Just for the purpose of illustration, the voltage clamping element 2 is drawn as a diode in the example shown in FIG. 1. A cathode node 22 of the diode is connected to the first input node $IN_1$ where the first supply potential is available, and an anode node 21 is connected to the second input node $IN_2$, where a second supply potential is available. The input voltage $V_{IN}$ is the difference between the first supply potential and the second supply potential. Further, the first supply potential available at the first input node $IN_1$ is higher than the second supply potential available that the second input node $IN_2$.

Figure 3A:
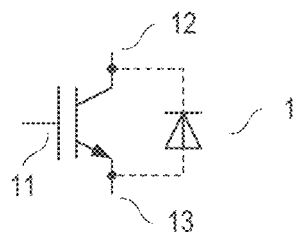
FIGS. 3A to 3C illustrate different examples of how electronic switches in the switching circuit shown in FIG. 1 may be implemented.
Figure 3B:
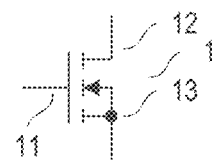
Figure 3C:
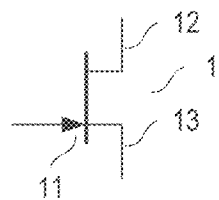

The high-side switch $1_1$ and the low-side switch $1_2$ are only schematically illustrated as electronic switches in the example shown in FIG. 1. These electronic switches $1_1$, $1_2$ can be implemented a various ways. Some examples are illustrated in FIGS. 3A to 3C. In FIG. 3A to 3C, reference character 1 denotes an arbitrary one of the high-side switch $1_1$ and the low-side switch $1_2$, and reference characters 11, 12 and 13 denote the control node, the first load node, and the load node, respectively, of the electronic switch 1. Referring to FIG. 3A, the electronic switch 1 may be implemented as an IGBT (Insulated Gate Bipolar Transistor). When implemented with an IGBT, a gate node of the IGBT forms the control node 11, a collector node of the IGBT forms the first load node 12, and an emitter node of the IGBT forms the second load node 13. Optionally, the IGBT includes an integrated diode (illustrated in dashed lines in FIG. 3A) that is connected between the first load 12 and the second load node 13.

According to another example shown in FIG. 3B, the electronic switch 1 includes a MOSFET (Metal Oxide Semiconductor Field-Effect Transistor). When implemented with a MOSFET, a gate node of the MOSFET forms the control node 11 of the electronic switch 1, a drain node of the MOSFET forms the first load node 12, and a source node forms the second load node 13. According to yet another example shown in FIG. 3C, the electronic switch 1 includes a JFET (Junction Field-Effect Transistor) or a HEMT (High Electron Mobility Transistor). When implemented with a JFET or a HEMT, a gate node of the JFET or HEMT forms the first control node 11, a drain node forms the first load node 12, and a source node forms the second load node 13.

According to one example, the same type of electronic switch is used to implement the high-side switch $1_1$ and the low-side switch $1_2$. According to another example different types of electronic switches are used to implement the high-side switch $1_1$ and the low-side switch $1_2$. Further, two or more transistor devices may be connected in parallel in order to form one of the high-side switch $1_1$ or the low-side switch $1_2$. "Connected in parallel" in this context means that the load paths of the individual transistor devices are connected in parallel and that the control nodes of the individual transistor devices are connected so that these transistor devices receive the same drive signal. The transistor devices that are connected in parallel can be transistor devices of the same type. That is, two or more IGBTs, MOSFETs, JFETs, or HEMTs may be connected in parallel. However, it is also possible to have transistor devices of different types connected in parallel so that, for example, at least one MOSFET is connected in parallel with at least one IGBT. This, however, is only an example. Other combinations may be used as well.

Referring to FIG. 1, optionally, a first freewheeling element $5_1$ is connected in parallel with the load path $12_1$-$13_1$ of the high-side switch 11, and a second freewheeling element $5_2$ is connected in parallel with the load path $12_2$-$13_2$ of the low-side switch $1_2$. According to one example, the freewheeling elements $5_1$, $5_2$ are discrete devices additionally to the high-side switch $1_1$ and the low-side switch $1_2$. According to another example, the freewheeling elements $5_1$, $5_2$ are integrated in the high-side switch $1_1$ or the low-side switch $1_2$. If, for example, the high-side switch $1_1$ and the low-side switch $1_2$ are MOSFETs, an internal body diode of the MOSFET may be used as the respective freewheeling element.

Figure 4:
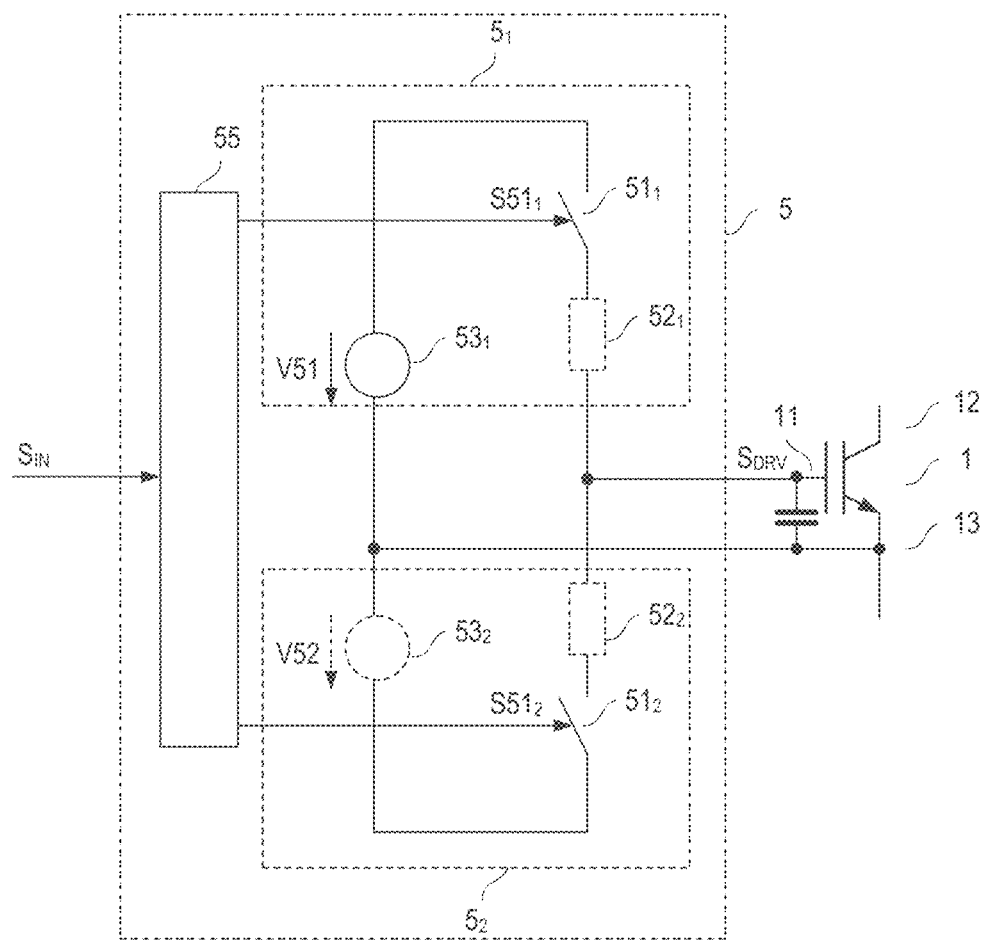
FIG. 4 shows one example of a drive circuit for driving one electronic switch in the half-bridge circuit shown in FIG. 1.

One example of a drive circuit 6 capable of driving the high-side switch $1_1$ or the low-side switch $1_2$ is shown in FIG. 4. FIG. 4 shows one drive circuit 6 and one electronic switch 1. The electronic switch 1 shown in FIG. 4 represents an arbitrary one of the high-side switch $1_1$ and the low-side switch $1_2$. Two drive circuits of the type shown in FIG. 4 can be implemented in the electronic circuit, one for driving the high-side switch $1_1$ and one for driving the low-side switch $1_2$. Just for the purpose of illustration, the electronic switch 1 is drawn as an IGBT in the example shown in FIG. 4. This, however, is only an example. Any other type of electronic switch may be used instead of an IGBT as well.

The IGBT 1 shown in FIG. 4, as well as any other type of transistor device explained with reference to FIGS. 3A to 3C, is a voltage controlled device. In this case, the drive signal SDRV is a voltage between the control node 11 and the second load node 13. That is, the drive signal SDRV, in an IGBT, is a voltage between the gate node 11 and the emitter node 13 (in a MOSFET is a voltage between the gate node 11 and the source node 13, and in a HEMT or JFET is a voltage between the gate node 11 and the source node 13).

Referring to FIG. 4, the drive circuit 5 includes a first driver 51 and a second driver 52, each connected between the control node 11 and the second load node 13. The first driver 51 includes a first voltage source $53_1$, a first electronic switch $51_1$, and an optional first resistor 521 connected in series between the control node 11 and the second load node 13 of the electronic switch 1. The second driver 52 includes an optional second voltage source $53_2$, a second electronic switch $51_2$, and an optional second resistor $52_2$ connected in series between the control node 11 and the second load node 13 of the electronic switch 1. The first driver $5_1$ is activated when the first switch $51_1$ is switched on and deactivated when the first switch $51_1$ is switched off. The second driver is activated when the second switch $51_2$ is switched on and deactivated when the second switch $51_2$ is switched off. The first and second drivers $5_1$, $5_2$ are activated and deactivated by a control circuit 55 dependent on an input signal $S_{IN}$. The input signal $S_{IN}$ indicates whether it is desired to switch on or switch off the electronic switch 1. When the input signal $S_{IN}$ indicates that it is desired to switch on the electronic switch 1, the control circuit $5_5$ activates the first driver $5_1$ by switching on the first electronic switch $51_1$ and deactivates the second driver $5_2$ by switching off the second electronic switch $51_2$. When the first driver $5_1$ is activated, the drive signal $S_{DRV}$ essentially equals the voltage V51 provided by the voltage source $53_1$ of the first driver $5_1$. When the input signal $S_{IN}$ indicates that it is desired to switch off the electronic switch 1, the control circuit 55 deactivates the first driver $5_1$ by switching off the first switch $51_1$ and activates the second driver $5_2$ by switching on the second switch $51_2$. When the second driver is active, the drive signal $S_{DRV}$ essentially equals zero or, when the second driver $5_2$ is implemented with voltage source $53_2$, the inverted voltage level −V52 of the voltage generated by the voltage source $53_2$.

The input signal SIN may be generated by any type of controller, such as a microcontroller, dependent on a desired waveform of an output voltage at the output OUT of the half-bridge.

A voltage controlled electronic switch, such as any of the transistor devices shown in FIGS. 3A to 3C includes an internal capacitance (usually referred to as gate-emitter or gate-source capacitance) between the control node 11 and the second load node 13. This internal capacitance is illustrated by a capacitor connected between the gate node 11 and the second load node 13 in the example shown in FIG. 4. The electronic switch 1 switches on, when this internal capacitance has been charged such that the voltage across the internal capacitance is higher than a threshold voltage of the electronic switch 1, and switches off when this internal capacitance has been discharged such that a voltage across this internal capacitor is below the threshold voltage. The faster this internal capacitance is charged, the faster the electronic switch 1 switches on, and the faster is the internal capacitor is discharged, the faster the electronic switch 1 switches off. In order to adjust the switching speed when switching on, a resistance of the first optional resistor $52_1$ can be suitably adjusted. Equivalently, the switching speed when switching off can be adjusted by suitably adjusting a resistance of the second optional resistor $52_2$. In general, the switching speed increases as resistances of these resistors $52_1$, $52_2$ decrease.

Figure 5:
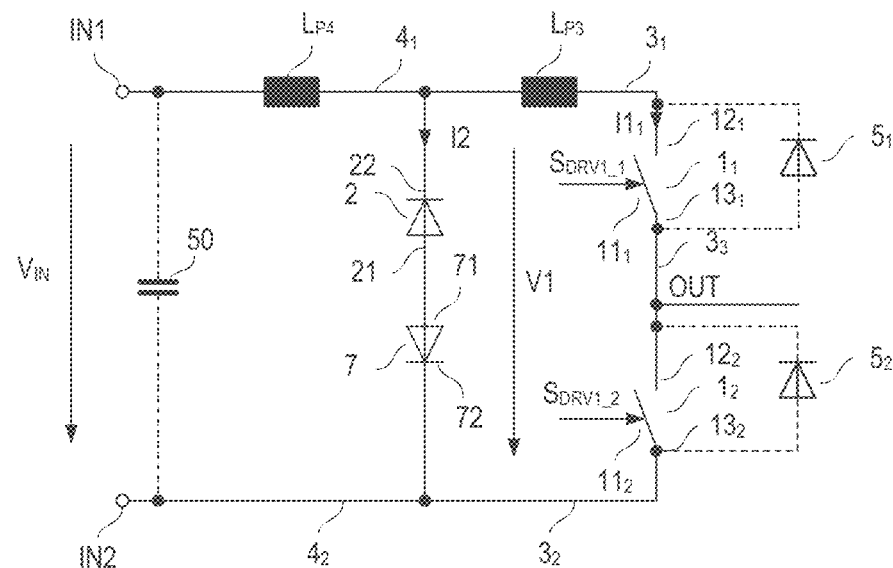
FIG. 5 shows an electronic circuit with a switching circuit according to another example.

FIG. 5 shows an electronic circuit according to another example. In this example, a rectifier element 7 is connected in series with the clamping element 2. According to one example, both, the clamping element 2 and the rectifier element 7 include a diode. In this case, the diode of the clamping element 2 and the diode of the rectifier element 7 are connected in a back-to-back configuration. In the example shown in FIG. 5, this is obtained by connecting an anode node 71 of the rectifier element 7 to the anode node 21 of the clamping element 2. A cathode node 72 of the rectifier element 7 is connected to the second input node IN2 in this example. According to another example shown in FIG. 6, the diode of the clamping element 2 and the diode of the rectifier element 7 are connected in a back-to-back configuration in that the cathode node 72 of the rectifier element 7 is connected to the cathode node 22 of the clamping element 2. The anode node 71 of the rectifier element 7 is connected to the first input node IN1 in this example.

According to one example, the rectifier element includes a Schottky diode, such as a silicon or silicon carbide Schottky diode. According to one example, a voltage blocking capability of this Schottky diode is independent of the input voltage VIN and, for example, less than 100V or even less than 50V, while the voltage blocking capability of the clamping element is higher than the input voltage $V_{IN}$. Dependent on the specific application in which the switching circuit with the half-bridge $1_1$, $1_2$ and the clamping element 2 is employed, the input voltage $V_{IN}$ can be selected from a range of between several 100 volts such as 600 volts and several kilovolts such as 4 kilovolts.

Figure 6:
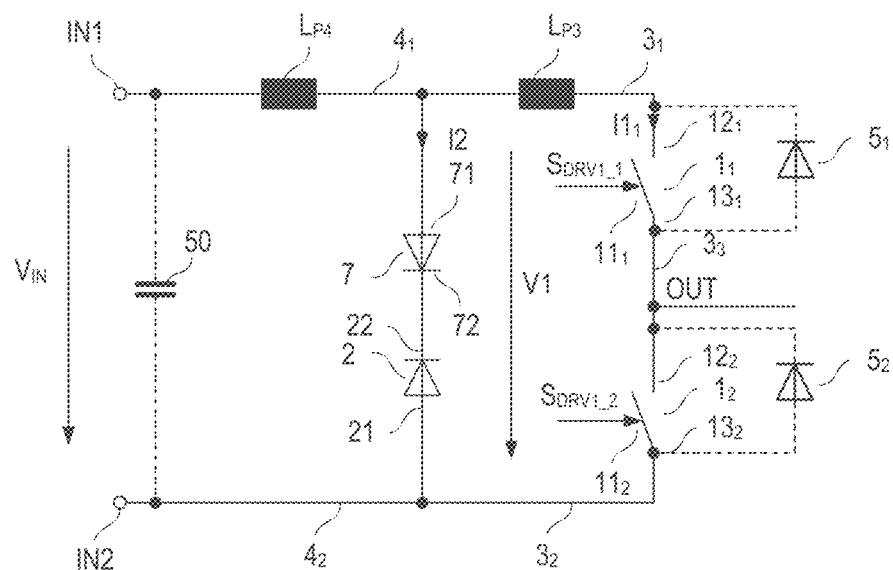
FIG. 6 shows a modification of the electronic circuit shown in FIG. 5.

According to one example, the clamping element 2 is a merged bipolar and Schottky diode, such as an MPS (Merged PIN Schottky) diode. This type of diode includes a bipolar diode in parallel with a Schottky diode integrated in one device. A vertical cross sectional view of an MPS diode is schematically illustrated in FIG. 6.

Figure 7:
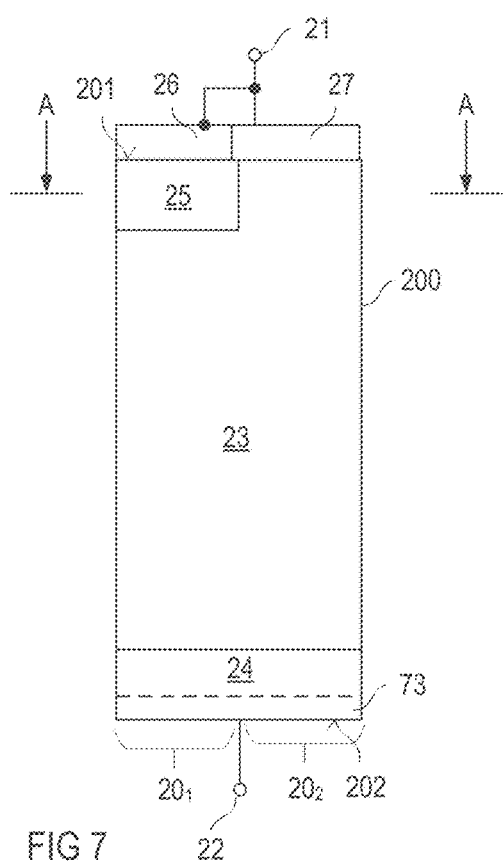
FIG. 7 shows a vertical cross sectional view of one example of a voltage clamping element used in the electronic circuit shown in FIG. 1.

FIG. 7 shows a vertical cross sectional view of one section of a semiconductor body 200 in which an MPS diode is integrated. According to one example, the semiconductor body 200 is a silicon carbide (SiC) semiconductor body. The semiconductor body includes a first surface 201. The vertical cross sectional view shown in FIG. 7 shows the semiconductor body 200 in a section plane perpendicular to the first surface 201.

The MPS diode integrated in the semiconductor body 200 includes an n-type base region 23 and an n-type first emitter region 24. The first emitter region 24 adjoins the base region 23 and a second surface 202 opposite the first surface 201. The first emitter region 24 is connected to the cathode node 22 or forms the cathode node 22 of the MPS diode. According to one example (not shown) a metallization is formed on the first emitter region 24 and forms an ohmic contact with the first emitter region 24. In this case, the metallization forms the cathode node 22 of the MPS diode.

Referring to FIG. 7, the MPS diode includes at least one first section 201 and at least one second section 202. Each of the first section 201 and the second section 202 includes a section of the base region 23 and the first emitter region 24. In the first section 201, the MPS diode additionally includes a p-type second emitter region 25. The second emitter region 25 adjoins the base region 23 and is ohmically connected to a first metallization 26 on top of the first surface 201. In the second section 202, the base region 23 extends to the first surface 201, and a Schottky contact is formed between the base region 23 and a second metallization 27 on top of the first surface 201. Both, the first metallization 26 and the second metallization 27 are connected to the anode node 21 or form the anode node 21 of the MPS diode. The MPS diode shown in FIG. 6 includes a bipolar diode formed in the first section 201 by the first metallization 26, the second emitter region 25, a section of the base region 23, and a Schottky diode formed in the second section $20_2$ by the second metallization 27, a section of the base region 23, and a section of the first emitter region 24. The bipolar diode and the Schottky diode are connected in parallel by having the first emitter region 24 in common and by virtue of the first metallization 26 and the second metallization 27 being connected to the anode node 21.

According to one example, the first metallization 26 includes at least one of a nickel-aluminum (NiAl) alloy, an aluminum-copper (AlCu) alloy, an aluminum-silicon-copper (AlSiCu) alloy, copper (Cu), or aluminum (Al). The second metallization 27, according to one example, includes at least one of titanium (Ti), molybdenum (Mo), molybdenum nitride (MoN), or titanium nitride (TiN). According to one example, the same type of metal is used for the first and second metallizations 26, 27. For example, the metals or metal alloys explained herein above in context for the first metallization 26 may also be used for the second metallization if a doping concentration of the base region 23 is lower than $1E18$ $cm^{-3}$, lower than $1E17$ $cm^{-3}$, or lower than $1E16$ $cm^{-3}$. In this case, these metals or metal alloys that form an ohmic contact with the p-type second emitter region 25 form a Schottky contact with the base region 23.

An MPS diode of the type shown in FIG. 7 has a high avalanche robustness. That is, the MPS diode can repeatedly be operated in an avalanche mode with output being damaged or destroyed. The MPS diode operates in the avalanche mode when a voltage is applied between the anode node 21 and the cathode node 22 that reverse biases a pn junction between the second emitter region 25 and the base region 23. When a voltage level of this voltage reaches an avalanche breakdown level of the MPS diode, an avalanche breakdown occurs at the pn junction, which causes the MPS diode to conduct a current until the voltage falls below the avalanche breakdown level. The avalanche breakdown occurs at the pn junctions spaced apart from the first surface 201, that is, deep in the semiconductor body 200. This makes MPS diode suitable to withstand the avalanche breakdown repeatedly.

According to one example, the clamping element 2 and the rectifier element 7 are integrated in the same semiconductor body 200. Referring to FIG. 7, this may be obtained by forming a Schottky contact between the n-type emitter region 24 and the cathode node 22. Forming such Schottky contact may include forming a Schottky metal 73 on the n-type emitter region. This Schottky metal may include one of the metals or metal alloys explained with reference to the second metallization herein above.

Figure 8:
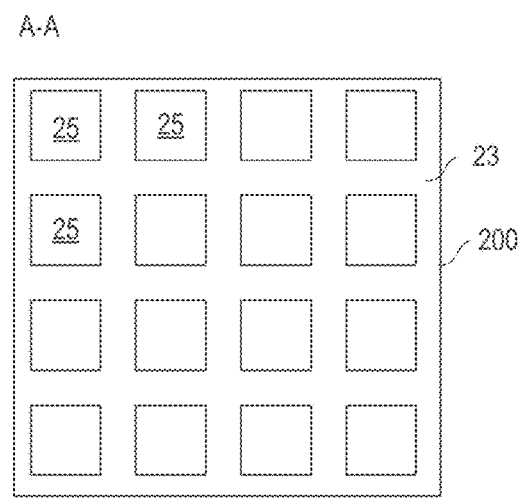
FIG. 8 shows a horizontal cross sectional view according to one example of the voltage clamping element shown in FIG. 7.

FIG. 7 only shows one section of an MPS diode. The MOS diode may include a plurality of device structures of the type shown in FIG. 7. One example is illustrated in FIG. 8 that shows a horizontal cross sectional view of an MPS diode in a section plane A-A (see FIG. 8) that goes through the second emitter region 25 and adjoining the regions of the base region 23. In the example shown in FIG. 8, the MPS diode includes a plurality of second emitter regions 25 separated by sections of the base region 23. Just for the purpose of illustration, the second emitter regions 25 are rectangular in the example shown in FIG. 8, this, however, is only an example. The second emitter regions 25 may be implemented with any other type of shape such as circular or hexagonal as well.

Figure 9A:
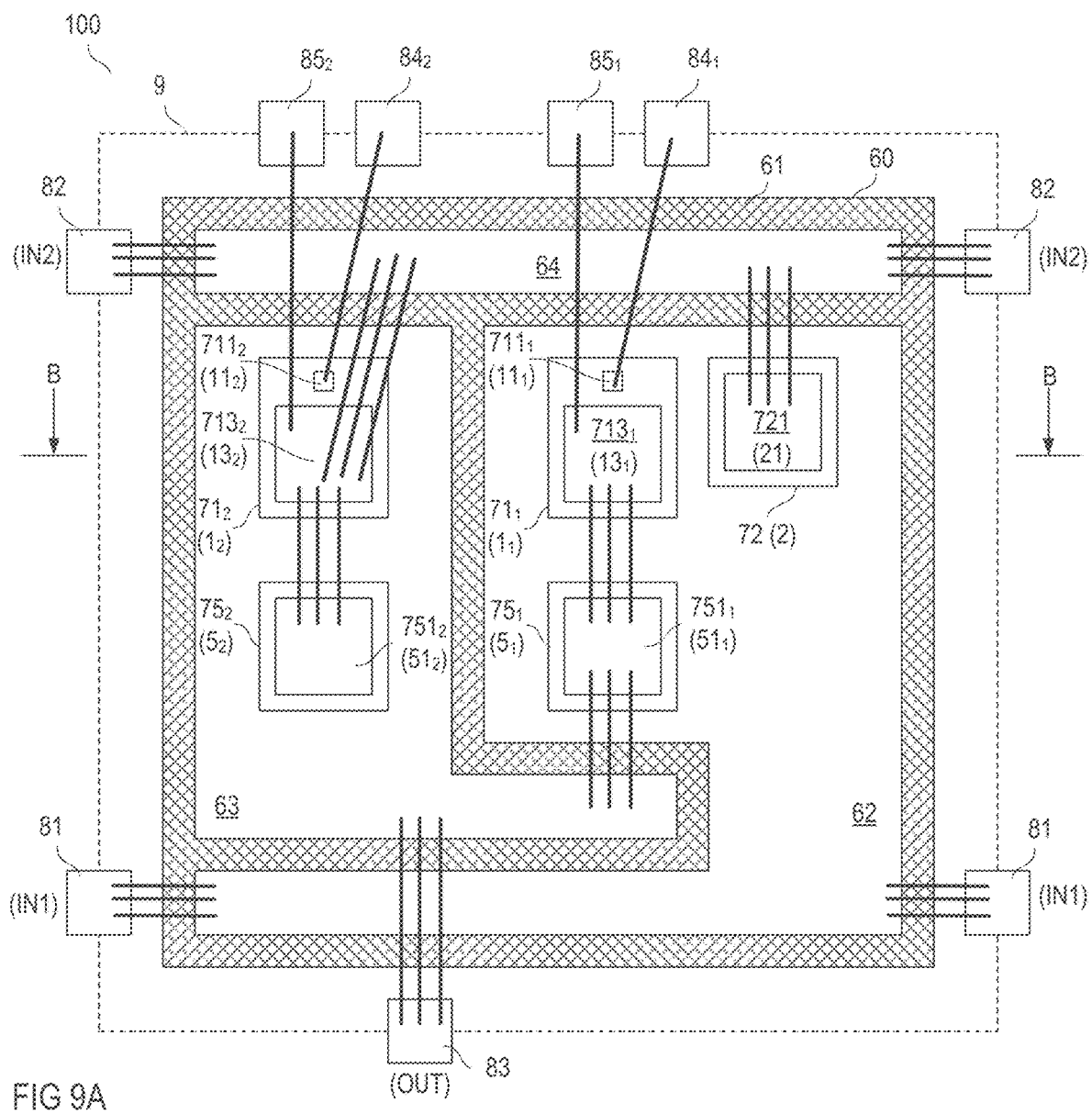
FIGS. 9A and 9B show one example of a module in which a switching circuit of the type shown in FIG. 1 is integrated.
Figure 9B:
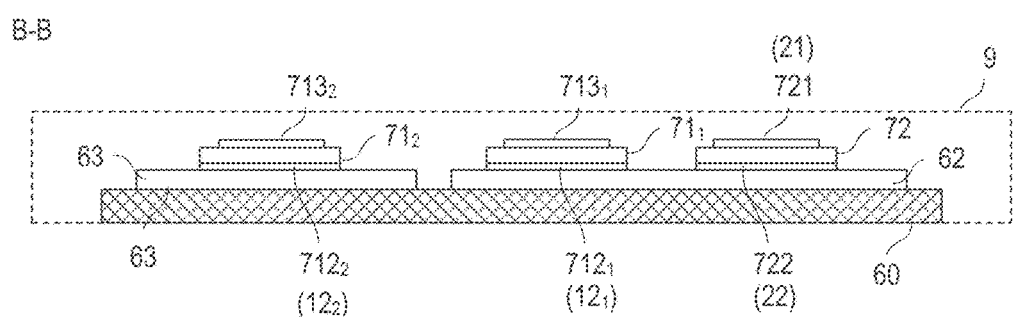

According to one example, the switching circuit with the half-bridge, the optional freewheeling elements 51, 52, and the clamping element 2 is integrated in a semiconductor module. One example of a semiconductor module in which the switching circuit is integrated is shown in FIGS. 9A and 9B. FIG. 9A shows a top view of the module, and FIG. 9B shows a vertical cross sectional view in a section plane B-B. In FIGS. 9A and 9B the reference characters in brackets next to or below the reference characters of the individual features of the module denote those features of the switching circuit that are formed by the respective feature of the module.

Referring to FIGS. 9A and 9B, the module includes a substrate 60 with an insulating carrier 61 and several metallizations 62, 63, 64 on top of the carrier 61. The individual metallizations 62, 63, 64 are spaced apart from each other. According to one example, the substrate 60 is a DCB (Direct Copper Bonding) substrate. In this example, the carrier 61 includes a ceramic material, and the metallizations 62, 63, 64 include copper. Further, the module includes a first semiconductor chip $71_1$ in which the high-side switch $1_1$ is integrated, a second semiconductor chip $71_2$ in which the low-side switch 12 is integrated, a third semiconductor chip 72 in which the clamping element 2 is integrated, a fourth semiconductor chip $75_1$ in which the first freewheeling element $5_1$ is integrated, and a fifth semiconductor chip $75_2$ in which the second freewheeling element $5_2$ is integrated. Each of the first and second semiconductor chips $71_1$, $71_2$ has a control pad $711_1$, $711_2$ on a first surface, a first load pad $712_1$, $712_2$ (see FIG. 9B) on a second surface, and a second load pad $713_1$, $713_2$ on the first surface. The control pad $711_1$, $711_2$ forms the control node 111, 112 of the electronic switch integrated in the respective semiconductor chip $71_1$, $71_2$, the first load pad $712_1$, $712_2$ forms the first load node $12_1$, $12_2$, and the second load pad 7131, 7132 forms the second load node $13_1$, $13_2$. The first load pads $712_1$, $712_2$ of the first and second semiconductor chip $71_1$, $71_2$ are mounted to substrate. In particular, the first load pad $712_1$ of the first semiconductor chip $71_1$ is mounted to and electrically connected with a first metallization 62 and the first load pad $712_2$ of the second semiconductor chip $71_2$ is mounted to and electrically connected with a second metallization 63. Mounting the first load pads $712_1$, $712_2$ to the first and second metallizations 62, 63 may include one of mounting these first load pads $712_1$, $712_2$ to the respective metallization by soldering, welding or gluing. However, solder layers, welding layers or glue layers are not shown in FIG. 9B.

The third semiconductor chip 72, in which the clamping element 2 is integrated, includes a first load pad $72_1$ on a first surface and a second load pad $72_2$ on a second surface. The first load pad $72_1$ forms the anode node 21 of the clamping element 2 and the second load pad $72_2$ forms the cathode node 22 of the clamping element 2. In the example shown in FIGS. 9A and 9B, the second load pad 722 of the third semiconductor chip 72 is mounted to and electrically connected to the first metallization 62, so that, via the first metallization 62, the cathode node 22 of the clamping element integrated in the third semiconductor chip 72 and the first load node 121 of the high-side switch 11 integrated in the first semiconductor chip $71_1$ are electrically connected.

Each of the fourth and fifth semiconductor chip $75_1$, $75_2$, in which the first freewheeling element $5_1$ and the second freewheeling element $5_2$, respectively, are integrated, includes a first load pad $751_1$, $751_2$ on a first surface and a second load pad (not visible in FIGS. 9A and 9B) on a second surface. The first load pad $751_1$, $751_2$ forms a first load node $51_1$, $51_2$ (see FIG. 1) of the respective freewheeling element $5_1$, $5_2$, and the second load pad forms a second load node $52_1$, $52_2$. According to one example, the freewheeling elements $5_1$, $5_2$ are diodes. In this example, the first load node $51_1$, $51_2$ is an anode node, and the second load node $52_1$, $52_2$ is a cathode node. In the example shown in FIG. 9A, the second load pad of the fourth semiconductor chip $75_1$ is mounted to and electrically connected with the first metallization 62 so that, via the second metallization 62, the second load node 521 of the freewheeling element $5_1$ integrated in the fourth semiconductor chip $75_1$ is electrically connected with the first load node 121 of the high-side switch $1_1$ integrated in the first semiconductor chip $71_1$. Further, the second load pad of the fifth semiconductor chip $75_2$ is mounted to and electrically connected with the second metallization 63, so that, via the second metallization 63, the second load node $52_2$ of the second freewheeling element $5_2$ is electrically connected with the first load node 122 of the low-side switch $1_2$ integrated in the second semiconductor chip $71_2$.

The module further includes a plurality of conductors. Just for the purpose of illustration these conductors are drawn as bond wires in the example shown in FIG. 9A. Such bond wires are represented by bold lines without reference characters in FIG. 9A. In some examples, several bond wires are connected in parallel between the same contact pads or metallizations. Using several bond wires in parallel, may help to reduce the electrical resistance and the parasitic inductance. Having several bond wires in parallel, however, is only an example. Instead of several bond wires in parallel, only one bond wire may be used. Alternatively, instead of one or more bond wires, a flat conductor, a copper clip, or a ribbon bonding may be used.

Referring to FIG. 9A, the second load pad $713_1$ of the first semiconductor chip $71_1$ that forms the second load node 131 of the high-side switch 11 is connected to the first load pad $751_1$ of the fourth semiconductor chip $75_1$, so as to electrically connect the second load node 131 of the high-side switch $1_1$ with the first load node $51_1$ of the first freewheeling element $5_1$. Equivalently, the second load pad $713_2$ of the second semiconductor chip $71_2$ is electrically connected with the first load pad $751_2$ of the fifth semiconductor chip $75_2$, so as to electrically connect the second load node 132 of the low-side switch 12 with the first load node $51_2$ of the second freewheeling element $5_2$. These electrical connections are formed by several bond wires in the example shown in FIG. 9A. This, however, is only an example. Any other type of conductor may be used to electrically connect these pads.

Referring to FIG. 9A, the module further includes input, output and control ports. Each of these ports may be formed by a flat conductor protruding from a housing 9 of the module. The housing is illustrated in dashed lines in FIGS. 9A and 9B. The housing covers the substrate 60 and the semiconductor chip $71_1$, $71_2$, $7_2$, $75_1$, $75_2$. According to one example, the carrier 61 of the substrate 60 is uncovered by the housing 9 at a surface facing away from the semiconductor chips, which makes it possible to directly mount the substrate 60 to a cooling element (not shown in the drawings). According to another example, the substrate 60 is completely molded and, therefore, also covered by the housing.

Referring to FIG. 9A, the module includes a first input port 81 and a second input port 82 that form the first input node IN1 and the second input node IN2, respectively. In the example shown in FIG. 9A, each of the first input port 81 and the second input port 82 includes two flat conductors.

The flat conductors that form the first input node 81 are electrically connected to the first metallization 62, and the flat conductors 82 that form the second input node are electrically connected to a third metallization 64. The module further includes an output port 83 formed by a further flat conductor. This output port 83 is electrically connected to the second metallization 63. For example, as shown in FIG. 9A, each of the electrical connections between one of these ports and one of these metallizations includes one or more bond wires.

Referring to FIG. 9A, the module further includes a first pair of control ports $84_1$, 851 and a second pair of control ports $84_2$, $85_2$. Each of these pairs includes a first control port $84_1$, $84_2$ and a second control port $85_1$, $85_2$. The first pair of control ports $84_4$, $85_1$ serves to receive a drive signal for the high-side switch 11 and the second pair of control ports $84_2$, $85_2$ serves to receive the drive signal for the low-side switch $1_2$. The first control port $84_1$ of the first pair is connected to the control pad $711_1$ of the first semiconductor chip $71_1$, and the second control pad $85_1$ of the first pair is connected to the second load pad $713_1$ of the first semiconductor chip $71_1$. Equivalently, the first control pad $84_2$ of the second pair is connected to the control pad $711_2$ of the second semiconductor chip $71_2$ and the second control pad $85_2$ of the second pair is connected to the second load pad $713_2$ of the second semiconductor chip $71_2$. For example, as shown in FIG. 9A, each of the electrical connections between one of control ports and one of the control or load pads includes one or more bond wires.

Further, in the module shown in FIG. 9A, the second load pad $713_2$ of the second semiconductor chip $71_2$ is connected to the third metallization 64 in order to connect the second load node 132 of the low-side switch $1_2$ integrated in the second semiconductor chip $1_2$ to the second input node IN2, the first load pad $72_1$ of the third semiconductor chip $7_2$ is connected to the third metallization 64 in order to connect the first load node 21 of the clamping element 2 integrated in the third semiconductor chip 2 to the second input node IN2, and the second load pad $713_1$ of the first semiconductor chip $71_1$ and the first load pad $751_1$ of the fourth semiconductor chip $75_1$ are connected to the second metallization 63 in order to connect the second load node 131 of the high-side switch 11 integrated in the first semiconductor chip ii and the first load node $51_1$ of the first freewheeling element 51 integrated in the fourth semiconductor chip $75_1$ to the output OUT. For example, as shown in FIG. 9A, each of the electrical connections between one of these load pads and one of these metallizations includes one or more bond wires.

In the half-bridge circuit shown in FIGS. 9A and 9B, conductors that connect the high-side switch $1_1$ and the low-side switch $1_2$ and that connect the half-bridge with the clamping element 2 are formed by the metallizations 62, 63, 64 and the bond wires. For example, the first conductor 31 shown in FIG. 1 is essentially formed by the second load pad $72_2$ of the second semiconductor chip 72, the first metallization and the first load pad $712_1$ of the first semiconductor chip $71_1$; the second conductor 32 is essentially formed by the first load pad $713_1$ of the first semiconductor chip 711 the connection that connects this first load pad $713_1$ to the second metallization 63, the second metallization 63, and the first load pad $712_2$ of the second semiconductor chip $71_2$; and the third conductor 33 is essentially formed by the second load pad $713_2$ of the second semiconductor chip $71_2$, the connection that connects this second load pad $713_2$ to the third metallization 64, the connection that connects the third metallization 64 to the first load pad $72_1$ of the third semiconductor chip 72, and the first load pad $72_1$ of the third semiconductor chip 72. By arranging the clamping element 2 inside the module a low parasitic first inductance of those conductors connecting the clamping element 2 with the half-bridge and connecting the high-side switch it and the low-side switch $1_2$ is obtained.

Figure 10:
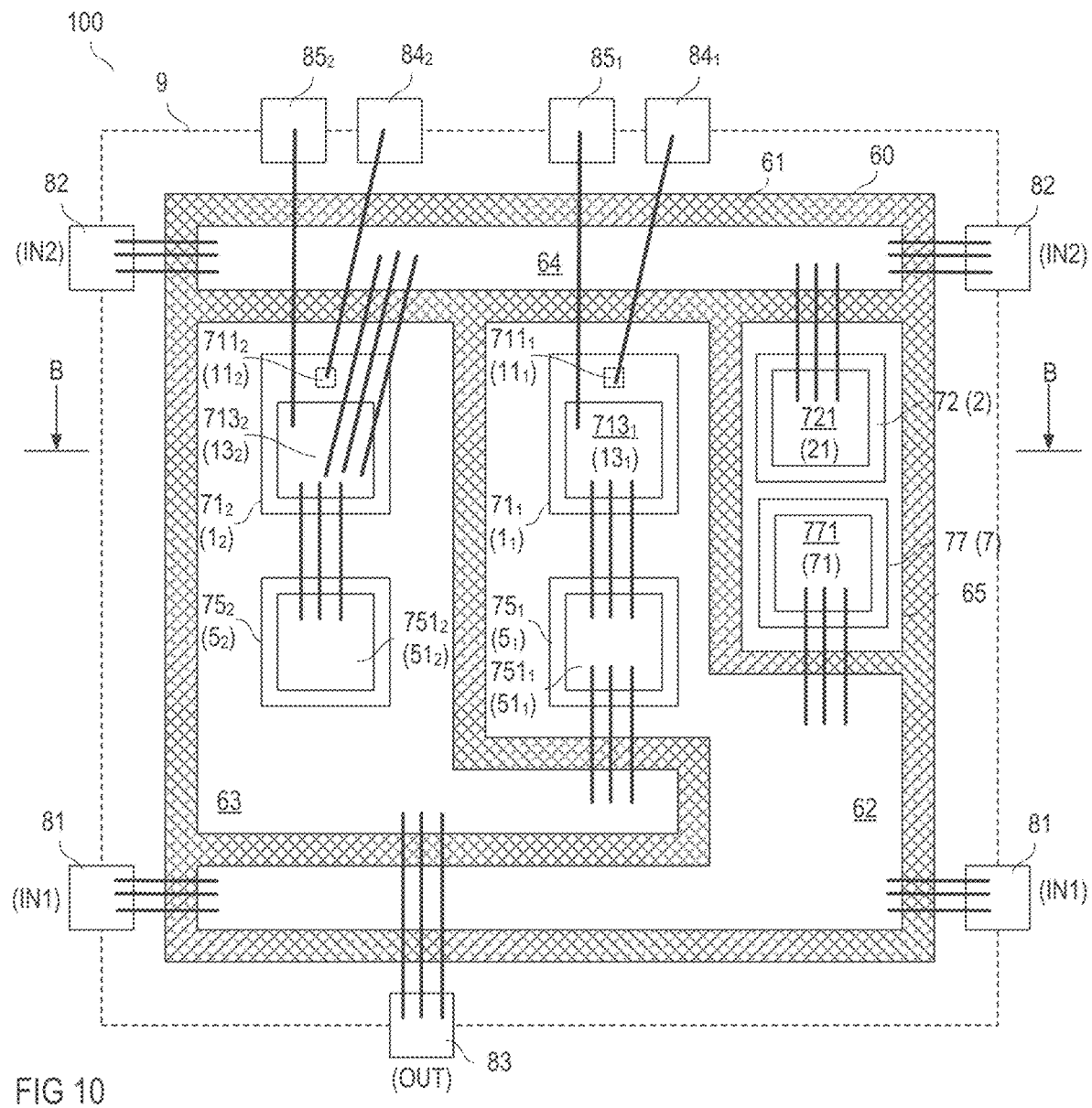
FIG. 10 shows one example of a module in which a switching circuit of the type shown in FIG. 6 is integrated.

FIG. 10 shows a top view of a modification of the module shown in FIGS. 9A and 9B. In this example, the module additionally includes a rectifier element 7 as shown in FIG. 6. The rectifier element 7 is integrated in a sixth semiconductor chip 77. This sixth semiconductor chip 77 and the third semiconductor chip 72 with the clamping element are mounted to a fourth metallization 65 such that a second load node of the clamping element 2 integrated in the third semiconductor chip 72 and a second load node of the rectifier element 7 integrated in the sixth semiconductor chip 77 are electrically connected via the fourth metallization 65. The second load node of the clamping element 2 is formed by a second load pad of the third semiconductor chip 72, and the second load node of the rectifier element 6 is formed by a second load pad of the sixth semiconductor chip 77. These second load pads are out of view in FIG. 10. According to one example, as shown in FIG. 6, the second load nodes of the clamping element 3 and the rectifier element 7 are cathode nodes so that the cathode nodes are connected by the fourth metallization 65.

Each of the third semiconductor chip 72 and the sixth semiconductor chip 77 includes a first load pad 721, 771 that forms a first load node of the clamping element 2 and the rectifier element 7. According to one example, the first load node is the anode node. These first load pads 721, 771 are arranged on surfaces of the third and sixth semiconductor chip 72, 77 that face away from the fourth metallization 65. In this example, the first load pad 721 of the third semiconductor chip 72 is connected to the third metallization 64 in order to connect the first load node (anode node) 12 of the clamping element 2 to the second input node IN2, and the first load pad 771 of the sixth semiconductor chip 77 is connected to the first metallization 62 in order to connect the first load node (anode node) 71 of the rectifier element 7 to the first input node $IN_1$.

If, as shown in FIG. 5, the anode nodes of the clamping element 2 and the rectifier element 7 are connected, the positions of the third and sixth semiconductor chips 72, 77 in the module are changed and these third and sixth semiconductor chips 72, 77 are flipped so that the fourth metallization 65 connects the second load pads 722, 772 forming the anode nodes, the cathode node of the clamping element 2 is connected to the first metallization 62 forming the first input $IN_1$, and the cathode node of the rectifier element 7 is connected to the third metallization 64 forming the second input IN2.

According to another example (not shown), the sixth semiconductor chip 77 with the rectifier element 7 and the third semiconductor chip 72 with the clamping element 2 are arranged in a chip-on-chip-configuration in a module of the type shown in FIG. 9A. For example, the sixth semiconductor chip 77 is arranged between the third semiconductor chip 72 and the bond wires connected to the third metallization 64 such that the first load pad of the sixth semiconductor chip 77 is connected to the first load pad 721 of the third semiconductor chip 72 and the second load pad $77_2$ of the sixth semiconductor chip 77 is connected to the third metallization.

Figure 11:
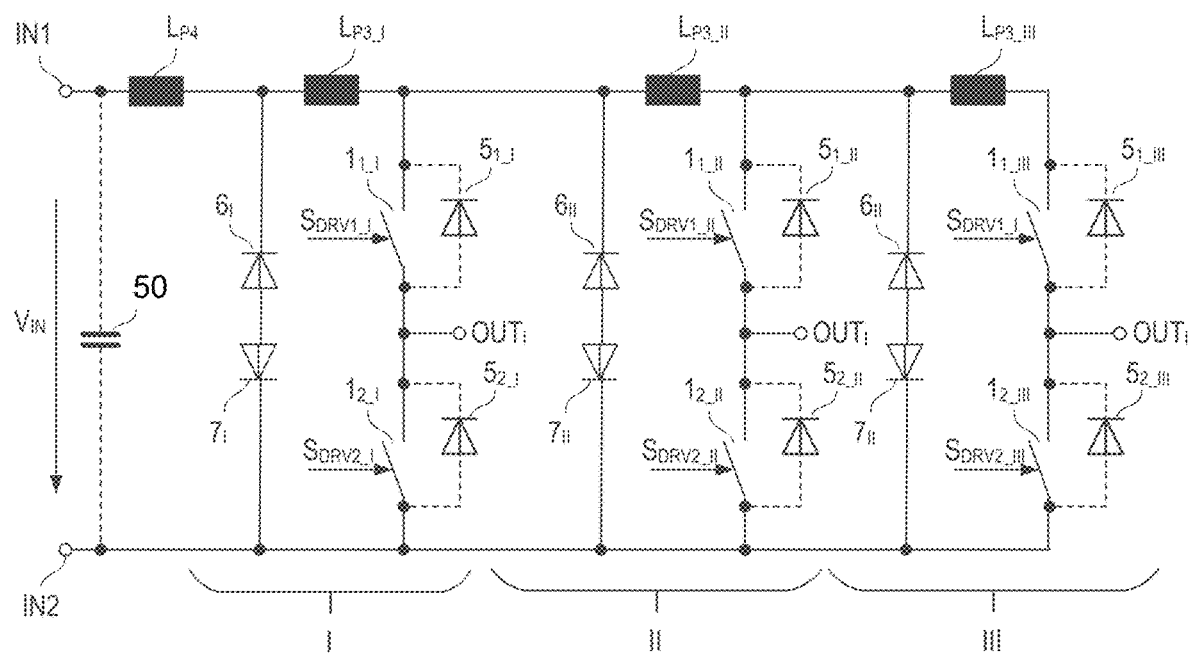
FIG. 11 shows one example of an electronic circuit that includes several switching circuits.

The electronic circuits shown in FIGS. 1 and 5 each include one switching circuit. This, however, is only an example. Referring to FIG. 11 several such switching circuits can be included in one electronic circuit. Just for the purpose of illustration, the electronic circuit shown in FIG. 11 includes three switching circuits I, II, III. Each of these switching circuits is implemented in accordance with the switching circuit shown in FIG. 5. In these switching circuits I, II, III the same reference characters as in FIG. 5 denote the same features, wherein the reference characters of switching circuit I have been supplemented by _I, the reference characters of switching circuit II have been supplemented by _II, and the reference characters of switching circuit III have been supplemented by _III. Each of these switching circuits is connected to the input $IN_1$, $IN_2$. The rectifier elements $7_I$, $7_{II}$, $7_{III}$ in the individual switching circuits may be omitted, which would result in switching circuits I, II, III of the type shown in FIG. 1. An electronic circuit of the type shown in FIG. 11 may be used in a three-phase inverter, for example.

Figure 12:
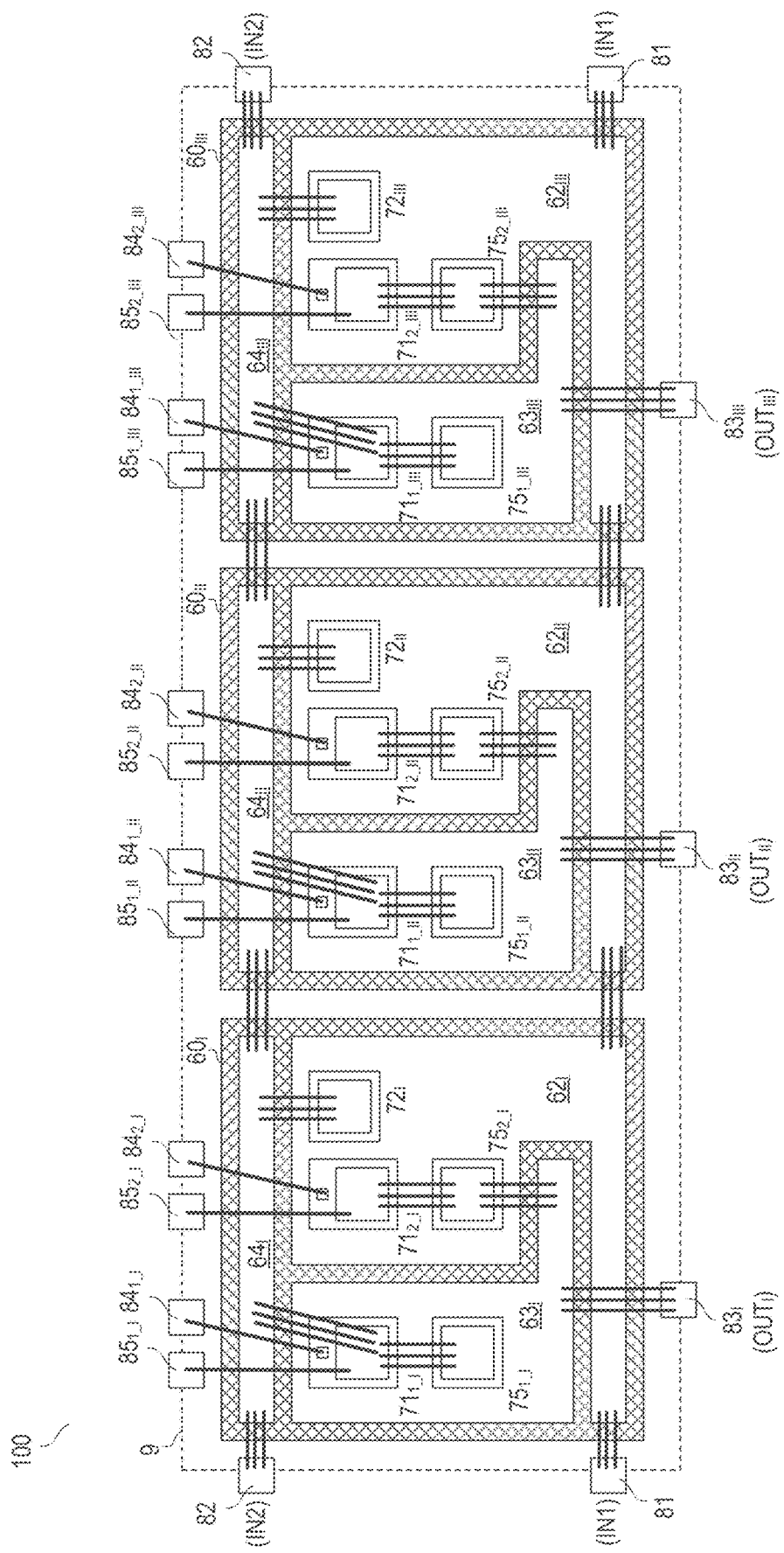
FIG. 12 illustrates a module in which several switching circuits are integrated.

FIG. 12 illustrates a module in which an electronic circuit with three switching circuits I, II, III of the type shown in FIG. 11, wherein the optional rectifier elements $7_I$, $7_{II}$, $7_{III}$ have been omitted. The module shown in FIG. 11 includes three submodules arranged in a common housing 9. Each of these submodules includes its own substrate and is implemented in the same way as the module shown in FIGS. 9A and 9B. In order to additionally implement the rectifier elements $7_I$, $7_{II}$, $7_{III}$ each of these submodules may be replaced by a module of the type shown in FIG. 10. In these submodules the same reference characters as in FIG. 9 denote the same features, wherein the reference characters of the submodule implementing the switching circuit I have been supplemented by _I, the reference characters of the submodule implementing the switching circuit II have been supplemented by _II, and the reference characters of the submodule implementing the switching circuit III have been supplemented by _III. In the module shown in FIG. 11, the three submodules have the first input port 81 in common and have the second input port 82 in common.

What is claimed is:

1. An electronic circuit comprising:
    at least one switching circuit, the at least one switching circuit comprising a voltage clamping element, and a half-bridge comprising a high-side switch and a low-side switch; and
    an input capacitor connected in parallel with the voltage clamping element,
    wherein the high-side switch and the low-side switch each comprise a control node and a load path,
    wherein the load paths of the high-side switch and the low-side switch are connected in series,
    wherein the voltage clamping element is connected in parallel with the half-bridge, and
    wherein a first overall inductance of first conductors connecting the high-side switch and the low-side switch and connecting the voltage clamping element with the half-bridge is less than 20 nH, and
    wherein a second overall inductance of second conductors connecting the input capacitor with the voltage clamping element is larger than the first overall inductance.

2. The electronic circuit of claim 1, wherein the first overall inductance is less than 10 nH or less than 5 nH.

3. The electronic circuit of claim 1, wherein a ratio between the second overall inductance and the first overall inductance is greater than 5.

4. The electronic circuit of claim 1, wherein at least one of the high-side switch and the low-side switch comprises at least one of an IGBT, a MOSFET, a JFET, or a HEMT.

5. The electronic circuit of claim 1, wherein the first conductors comprise at least one of a bond wire;
    a contact pad on a semiconductor chip;

a trace on a printed circuit board;
a flat conductor; or
a metallization on an insulating substrate.

6. The electronic circuit of claim 1, further comprising a rectifier element connected in series with the voltage clamping element.

7. The electronic circuit of claim 6,
wherein the voltage clamping element comprises a diode and the rectifier element comprises a diode, and
wherein the diode of the voltage clamping element and the diode of the rectifier element are connected in a back-to-back configuration.

8. The electronic circuit of one claim 1, wherein the voltage clamping element comprises an MPS diode.

9. The electronic circuit of claim 8, wherein the MPS diode is one of a SiC MPS diode, a Si MPS diode, or a GaN MPS diode.

10. The electronic circuit of claim 1, wherein the at least one switching circuit comprises two or more switching circuits coupled in parallel with each other.

11. The electronic circuit of one claim 1, further comprising:
a first freewheeling element connected in parallel with the high-side switch; and
a second freewheeling element connected in parallel with the low-side switch.

12. The electronic circuit of claim 1, wherein the at least one switching circuit is integrated in one module.

13. The electronic circuit of claim 12,
wherein the high-side switch of the half-bridge comprises at least one first semiconductor chip, the low-side switch of the half-bridge comprises at least one second semiconductor chip, and the voltage clamping element comprises at least one third semiconductor chip,
wherein the module comprise a substrate, and
wherein the least one first semiconductor chip, the at least one second semiconductor chip, and the at least one third semiconductor chip are mounted on the substrate.

14. The electronic circuit of claim 13,
wherein the substrate comprises a first metallization and a second metallization separate from the first metallization,
wherein the least one first semiconductor chip and the at least one third semiconductor chip being mounted to the substrate comprising the least one first semiconductor chip and the at least one third semiconductor chip being mounted to the first metallization, and
wherein the least one second semiconductor chip being mounted to the substrate comprising the least one second semiconductor chip being mounted to the second metallization.

15. A module comprising:
a first semiconductor chip disposed on a first metallization region of a substrate, the first semiconductor chip comprising a first switching transistor;
a second semiconductor chip disposed on a second metallization region of the substrate separate from the first metallization region, the second semiconductor chip comprising a second switching transistor, wherein the first switching transistor and the second switching transistor are coupled in series to form a half-bridge circuit having an output node coupled, and the second metallization region is electrically connected to an output node of the half-bridge circuit; and
a third semiconductor chip disposed on the first metallization region of the substrate, the third semiconductor chip comprising a diode circuit, wherein the diode circuit is coupled in parallel with the half-bridge circuit.

16. The module of claim 15, further comprising an output port, and a first electrical conductor connected between the output port and the second metallization region.

17. The module of claim 16, further comprising:
a first input port, and a second electrical conductor connected between the first input port and the first metallization region; and
a second input port, and a third electrical conductor connected between the second input port and a third metallization region of the substrate separate from the first metallization region and the second metallization region.

18. The module of claim 17, wherein a first overall inductance of conductors connecting the diode circuit, the first switching transistor and the second switching transistor is less than a second overall inductance of conductors connecting a capacitor coupled across the first input port and the second input port to the diode circuit.

19. The module of claim 18, wherein:
the first overall inductance is less than 20 nH; and
a ratio between the second overall inductance and the first overall inductance is greater than 5.

20. A method of operating an electronic circuit comprising a voltage clamping element, a half-bridge comprising a high-side switch and a low-side switch, and an input capacitor coupled in parallel with the voltage clamping element, wherein load paths of the high-side switch and the low-side switch are connected in series, the voltage clamping element is connected in parallel with the half-bridge, and a first overall inductance of first conductors connecting the high-side switch and the low-side switch and connecting the voltage clamping element with the half-bridge is less than 20 nH, and a second overall inductance of second conductors connecting the input capacitor with the voltage clamping element is larger than the first overall inductance, the method comprising:
applying a first drive signal to a control node of the high-side switch; and
applying a second drive signal to a control node of the low-side switch.

* * * * *